(12) United States Patent
Takahashi

(10) Patent No.: US 7,263,890 B2
(45) Date of Patent: Sep. 4, 2007

(54) VACUUM CLAMPING DETECTION METHOD AND VACUUM CLAMPING DETECTOR

(75) Inventor: Yuji Takahashi, Tokyo (JP)

(73) Assignee: Koganei Corporation, Tokyo (JP)

( * ) Notice: Subject to any disclaimer, the term of this patent is extended or adjusted under 35 U.S.C. 154(b) by 90 days.

(21) Appl. No.: 10/558,127

(22) PCT Filed: May 26, 2004

(86) PCT No.: PCT/JP2004/007567

§ 371 (c)(1),
(2), (4) Date: Nov. 23, 2005

(87) PCT Pub. No.: WO2004/106010

PCT Pub. Date: Dec. 9, 2004

(65) Prior Publication Data

US 2006/0247813 A1   Nov. 2, 2006

(30) Foreign Application Priority Data

May 27, 2003  (JP) .............................. 2003-148948

(51) Int. Cl.
*H05K 3/30* (2006.01)
(52) U.S. Cl. ............................. 73/700; 29/740; 29/64.1
(58) Field of Classification Search .................. 73/700; 29/740, 64.1
See application file for complete search history.

(56) References Cited

U.S. PATENT DOCUMENTS

| | | | |
|---|---|---|---|
| 5,231,753 A * | 8/1993 | Tanaka et al. ................. | 29/741 |
| 5,654,631 A * | 8/1997 | Ames ....................... | 324/158.1 |
| 5,961,169 A * | 10/1999 | Kalenian et al. ........... | 294/64.1 |
| 6,000,122 A * | 12/1999 | Uchida et al. ................. | 29/740 |
| 6,318,777 B1 | 11/2001 | Tanaka et al. ............. | 294/64.1 |
| 6,817,639 B2 | 11/2004 | Schmalz et al. ........... | 294/64.1 |
| 7,187,433 B2 * | 3/2007 | Ottens et al. .................. | 355/72 |

FOREIGN PATENT DOCUMENTS

| | | |
|---|---|---|
| JP | 06-305608 | 11/1994 |
| JP | 10-128690 | 5/1998 |
| JP | 2000-117676 | 4/2000 |
| JP | 2001-054886 | 2/2001 |

\* cited by examiner

*Primary Examiner*—Andre J. Allen
(74) *Attorney, Agent, or Firm*—McCormick, Paulding & Huber LLP

(57) ABSTRACT

When suction/release-passage-internal pressure $Pin$ is equal to or less than a suction detection pressure $Pj$, a suction of a workpiece is detected and a transfer operation is started. As long as the suction/release-passage-internal pressure $Pin$ does not rise to pressure having an upper limit value or more of the drop detection range during a transfer, it is recognized that the workpiece is not dropped from the sucker. The drop detection range is computed by adding predetermined allowable deflection width $\Delta D$ to the suction/release-passage-internal pressure $Pin$ that is read as reference pressure under the condition that the workpiece is sucked by the sucker.

6 Claims, 6 Drawing Sheets

VACUUM CLAMPING DETECTION METHOD AND VACUUM CLAMPING DETECTOR

CROSS REFERENCE TO RELATED APPLICATIONS

This application claims the benefit of PCT Application No. PCT/JP2004/007567, filed on May 26, 2004 and Japanese Patent Application No. 2003-148948, filed May 27, 2003, the disclosures of which are herein incorporated by reference in their entirety.

TECHNICAL FIELD

The present invention relates to a suction detection method and a suction detection apparatus for detecting suction of a workpiece, the suction detection method and apparatus being effectively used for a vacuum-suction/transfer apparatus for transferring, as a workpiece, an electronic component such as IC and LSI to a test instrument, a printed circuit board or the like by vacuum suction.

BACKGROUND OF THE INVENTION

Many electronic components including an IC, LSI or the like in which a semiconductor integrated circuit is formed are placed on the test instrument, and whether each electronic component has a predetermined function is tested. At this time, each electronic component disposed on a tray or the like is carried to the test instrument by a transfer apparatus. Further, even when the electronic components are placed on the test instrument, a plurality of kinds of electronic components are carried to the printed circuit board sequentially in predetermined order by using the transfer apparatus.

As such a transfer apparatus, there has been well known an apparatus in which: a horizontally movable carrying head is provided with a sucker to be movable vertically; and the carrying head is moved to predetermined positions of a component supply stage and the test instrument; and the sucker is moved vertically at each predetermined position of the component supply stage and the test instrument. A suction/release passage, which is connected to a positive pressure source and a negative pressure source and opened to a contact face that contacts with the workpiece, is formed in the sucker so that, on the component supply stage, negative pressure is supplied to the suction/release passage and the sucker is brought into contact with the workpiece to suck the workpiece. After the workpiece is transferred to the predetermined position of the test instrument, the supply of the negative pressure to the suction/release passage is stopped to place the workpiece on the test instrument and positive pressure air for vacuum breakage is supplied to the suction/release passage so that the workpiece can be securely released from the sucker. Then, the carrying head, which has released the workpiece, returns to the component supply stage, and the transfer of the workpieces is repeated in the same procedure.

In such a suction/transfer apparatus, the transfer operation is performed after confirming that the workpiece has been sucked by the sucker in order to prevent missing or dropping of the workpiece during the transfer. As means for such suction confirmation, a conventional suction/transfer apparatus has a suction pressure sensor for detecting pressure in the suction/release passage, which detects the suction of the workpiece when a negative pressure value in the suction/release passage increases to or beyond its suction detection value during a suction operation. For example, the suction/transfer apparatus disclosed in Japanese Patent Laid-Open Publication No. 2001-54886 (pages 5-6 and FIG. 8) detects a suction-preparation pressure Pset when the negative pressure is supplied to the sucker, and detects the suction of the workpiece when the negative pressure value of the suction/release passage reaches suction detection pressure Pj obtained by adding a predetermined suction detection value ΔPset to this suction-preparation pressure Pset.

It is desirable in use that the suction/transfer apparatus can recognize the drop of the workpiece even during the transfer. However, in the above-described conventional technique, the release of the workpiece from the sucker is detected only when the negative pressure value of the suction/release passage is equal to or less than a release pressure value Preset set at negative pressure lower than the suction preparation pressure Pset. Therefore, even if the workpiece drops during the transfer and the sucker becomes in a state of sucking nothing, the negative pressure value of the suction/release passage is not reduced below the suction preparation pressure Pset, so that the drop of the workpiece cannot be recognized during the transfer.

Here, as means for securely detecting a suction/release condition of the workpiece, a recognition method by image sensor has been generally known. However, drop recognition by the image sensor is generally too expensive to be attached to a general-purpose suction/transfer apparatus, so that such an apparatus is difficult to use actually.

An object of the present invention is to be capable of securely detecting the drop of the workpiece from the sucker when the workpiece is transferred by the sucker.

SUMMARY OF THE INVENTION

A suction detection method according to the present invention is a method for making a detection of whether a workpiece is sucked by a sucker having a suction/release passage connected to a negative pressure passage, and comprises: a reference pressure reading step of reading, as reference pressure, pressure in said suction/release passage under the condition that the workpiece is sucked by said sucker; a drop-detection range setting step of setting a drop detection range by adding predetermined allowable deflection width (tolerance) to said reference pressure; a drop-detection pressure reading step of reading, as drop detection pressure, the pressure in said suction/release passage; a recognizing step of recognizing whether said drop detection pressure is equal to or more than an upper limit value of said drop detection range; and a drop-signal outputting step of outputting a drop signal when it is recognized that said drop detection pressure is equal to or more than said upper limit value.

The suction detection method according to claim the present invention further comprises a rewriting step of being rewritten to a new drop detection range when said reference pressure is different from the previous reference pressure.

The suction detection method according to the present invention is such that, by reading said reference pressure based on a reference-pressure reading instruction and then reading said drop detection pressure based on a drop-detection pressure reading instruction, it is recognized whether said drop detection pressure is equal to or more than an upper limit value of said drop detection range.

A suction detection apparatus according to the present invention is an apparatus to detect whether a workpiece is sucked by a sucker having a suction/release passage connected to a negative pressure source, and comprises: a reference pressure reading means for reading, as reference pressure, pressure in said suction/release passage under the condition that the workpiece is sucked by said sucker; a drop-detection range setting means for setting a drop detection range by adding predetermined allowable deflection width to said reference pressure; a drop-detection pressure reading means for reading, as drop detection pressure, the pressure in said suction/release passage; a recognizing means for recognizing whether said drop detection pressure is equal to or more than an upper limit value of said drop detection range; and a drop-signal outputting means for outputting a drop signal when it is recognized that said drop detection pressure is equal to or more than said upper limit value.

The suction detection apparatus according to the present invention is such that the drop detection range is newly rewritten if said reference pressure is different from the previous reference pressure.

The suction detection method according to the present invention is such that by reading said reference pressure based on a reference-pressure reading instruction and then reading said drop detection pressure based on a drop-detection pressure reading instruction, it is recognized whether said drop detection pressure is equal to or more than the upper limit value of said drop detection range.

According to the invention, the suction of the workpiece by the sucker can be securely detected also during the transfer of the workpiece.

Even when the plurality of workpieces are once transferred by the vacuum-suction/transfer apparatus connecting the plurality of suckers to the common negative source through the common suction unit, the suction of the workpiece by the sucker can be securely detected.

By operating the apparatus controller, the timing of the drop recognition for the suction detection apparatus can be changed freely.

DESCRIPTION OF PREFERRED EMBODIMENTS

Hereinafter, embodiments of the present invention will be described in details with reference to the accompanying drawings.

Figure 1A:
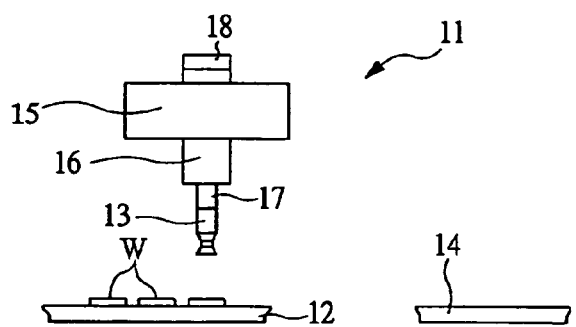
FIGS. 1A to 1E are explanatory diagrams showing a transfer procedure for sucking and transferring a workpiece by a vacuum-suction/transfer apparatus equipped with a suction detection apparatus according to an embodiment of the present invention.
Figure 1B:
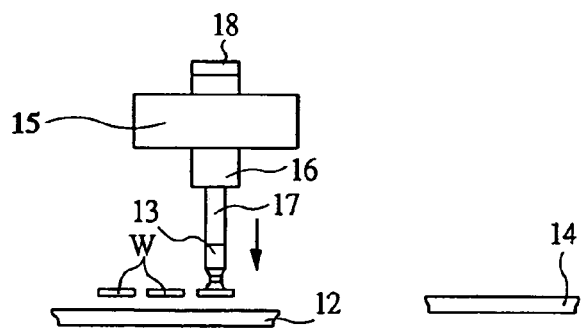
Figure 1C:
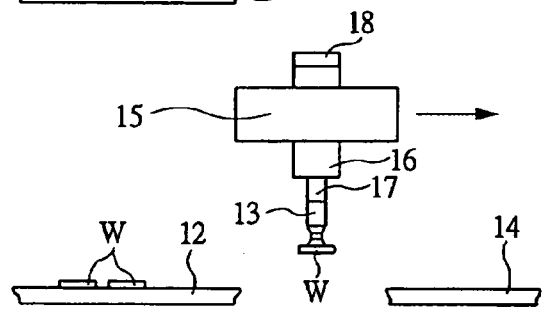
Figure 1D:
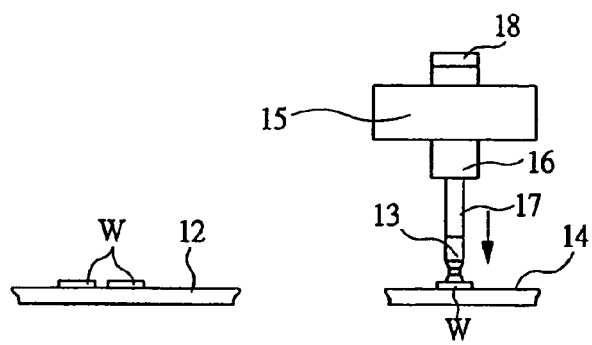
Figure 1E:
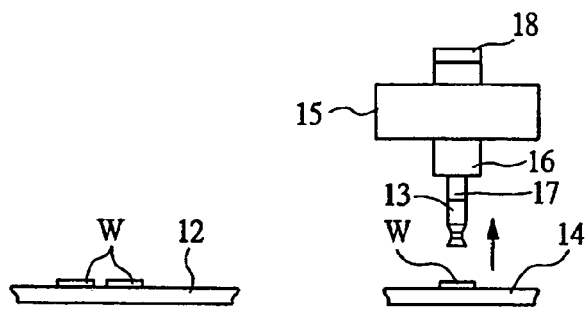
Figure 2:
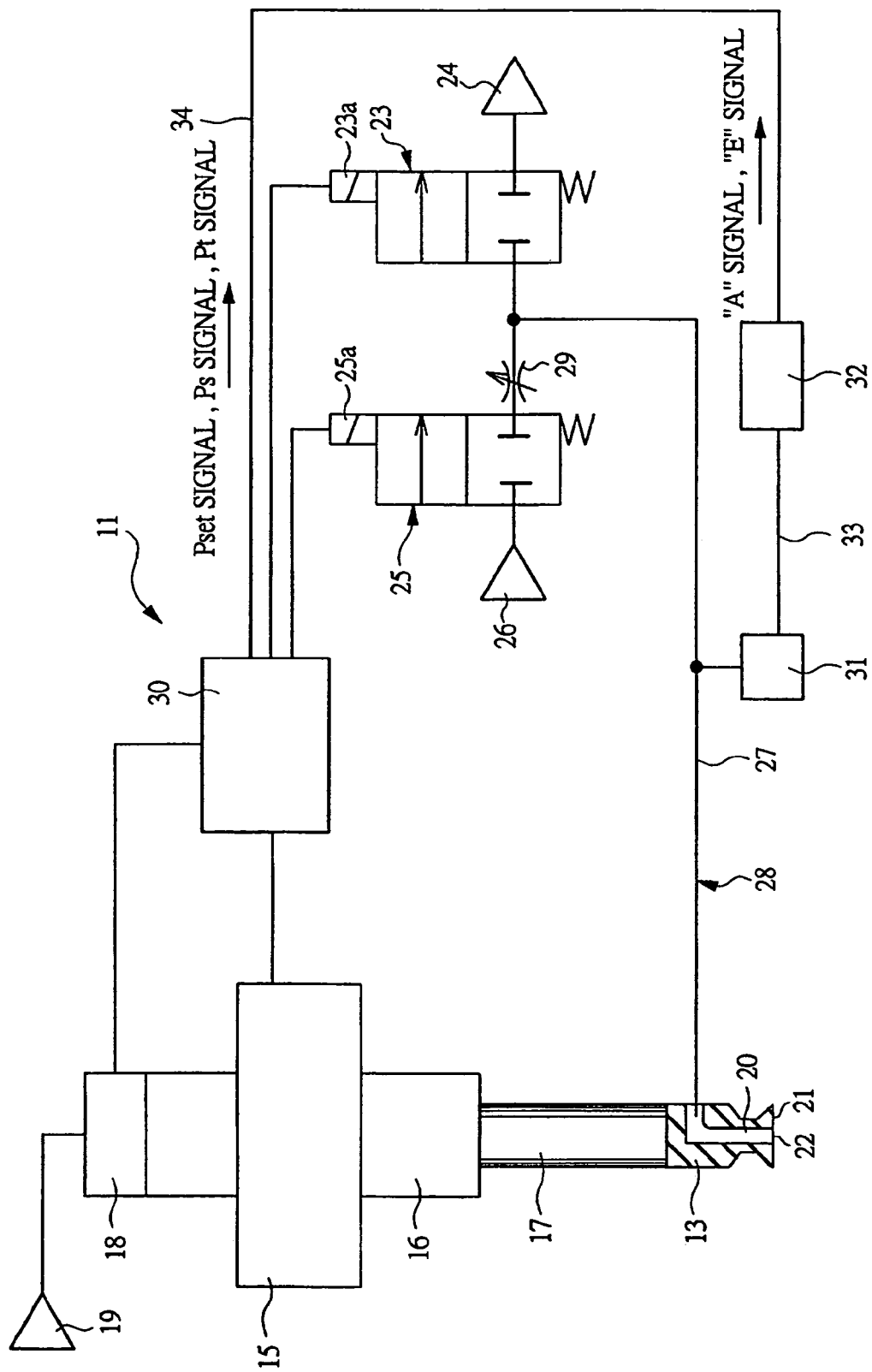
FIG. 2 is a block diagram showing schematically the vacuum-suction/transfer apparatus shown in FIG. 1.

FIGS. 1A to 1E are explanatory diagrams showing a transfer procedure for sucking and transferring a workpiece by a vacuum-suction/transfer apparatus equipped with a suction detection apparatus according to an embodiment of the present invention, and FIG. 2 is a block diagram showing schematically the vacuum-suction/transfer apparatus shown in FIG. 1.

As shown in FIGS. 1A to 1E, this vacuum-suction/transfer apparatus 11 transfers, as workpieces W, electronic components such as ICs disposed on a component supply stage 12 to a printed circuit board 14 by sucking them using a sucker 13.

This vacuum-suction/transfer apparatus 11 has a horizontally movable carrying head 15, so that the carrying head 15 can be driven horizontally between the component supply stage 12 and the printed circuit board 14 by an unshown electronic motor etc. A pneumatic cylinder 16 is fixed to the carrying head 15, and a piston rod 17 is attached to this pneumatic cylinder 16 so as to be reciprocable vertically. A positive pressure source 19 is connected to the pneumatic cylinder 16 through an electromagnetic valve 18. When no current flows in the electromagnetic valve 18, the piston rod 17 is retained at its retraction limit position. If a current flows in the electromagnetic valve 18, the piston rod 17 advances downward in these Figures due to compressed air supplied from the positive pressure source 19. Then, the sucker 13 is attached to a tip of the piston rod 17.

The sucker 13 is also called a suction gripper or vacuum gripper and, as shown in FIG. 2, has a hollow space in which an air-flow passage 20 is formed. This air-flow passage 20 is provided at a tip of the sucker 13 and is opened to a contact face 21 that contacts with the workpiece W, and a tip portion of the air-flow passage 20 serves as a vacuum suction port 22. A communication passage 27, which is connected to a negative pressure source 24 through a vacuum supply valve 23 and connected to a positive pressure source 26 through a vacuum breakage valve 25, is connected to the air-flow passage 20, so that a suction/release passage 28 is formed by the air-flow passage 20 and the communication passage 27.

The vacuum supply valve 23 is an electromagnetic valve which opens/closes a flow passage by current-carrying control with respect to a solenoid 23a, so that when a current flows in the solenoid 23a, the vacuum supply valve is set to an open position for communicating the suction/release passage 28 with the negative pressure source 24 and if flow of the current into the solenoid 23a is interrupted, it is set to a close position for closing the suction/release passage 28. The vacuum breakage valve 25 is similarly an electromagnetic valve which opens/closes a flow passage by the current-carrying control with respect to a solenoid 25a, so that when the current flows in the solenoid 25a, the vacuum breakage valve is set to an open position for communicating the suction/release passage 28 with the positive pressure source 26 and if the flow of the current into the solenoid 25a is interrupted, it is set to a close position for closing the suction/release passage 28. This vacuum breakage valve 25 is provided with a variable throttle 29 for adjusting a flow rate of compressed air.

The vacuum-suction/transfer apparatus 11 is provided with an apparatus controller 30, which includes an unshown micro processor for computing various kinds of control signals, and unshown memories such as a ROM for storing control program, operational expressions, and data table, etc. and a RAM for storing temporary data. An unshown electric motor for driving the electromagnetic valve 18 and the above-mentioned pneumatic cylinder 16, the solenoids 23a, 25a of the respective valves 23, 25, and the carrying head 15 is connected to the apparatus controller 30, so that operations of these members are controlled by the apparatus controller 30.

A suction pressure sensor 31 is connected to the suction/release passage 28, thereby making it possible to detect suction/release-passage-internal pressure Pin. Detected pressure value of the suction pressure sensor 31 is gauge pressure in which atmospheric pressure is used as a reference, and even when the suction/release passage 28 is connected to either the negative pressure source 24 or the positive pressure source 26, the suction/release-passage-internal pressure Pin can be detected. The suction/pressure sensor 31 is separated from a suction detection apparatus 32, and these are connected through a communication cable 33. And, the detected suction/release-passage-internal pressure Pin is inputted as a voltage or current signal to the suction detection apparatus 32.

The suction detection apparatus 32 is connected respectively to the suction pressure sensor 31 and the apparatus controller 30 through communication cables 33, 34, and has an unshown micro processor computing various kinds of control signals and an unshown memory including a ROM and a RAM, etc. similarly to the apparatus controller 30. Various kinds of values such as suction detection pressure value Pj, a suction detection value ΔPset, a release pressure value Preset, an unreachable value Pu, and allowable deflection width ΔD, etc. are stored in the memory. These values can be changed by operating an unshown key or dial provided on the suction/detection apparatus 32 or by sending a signal from the apparatus controller 30. These values are preliminarily set based on an experiment or the like and, particularly, the unreachable value Pu is set at such high a negative pressure value that suction preparation pressure Pset cannot reach even if various conditions change, for example, an inner diameter of the suction/release passage 28 decreases. For example, in this embodiment, the unreachable value Pu is set at −101.3 kPa which is an absolute vacuum under the gauge pressure.

The suction/detection apparatus 32 can recognize whether the suction/release-passage-internal pressure Pin is positive pressure or negative pressure and, in order to detect the suction of the workpiece W, reads the suction preparation pressure Pset and adds a predetermined suction detection value ΔPset to this value to set the suction detection pressure Pj. After the transfer is started, the suction/release-passage-internal pressure Pin is read as reference pressure Ps and the predetermined allowable deflection width ΔD is added to the above internal pressure Pin to set a drop detection range. At the same time, during the transfer of the workpiece W, the drop of the workpiece W is detected after receiving an instruction from the apparatus controller 30. Further, after ending the transfer of the workpiece W, detection of a release pressure value Preset means the release of the workpiece W, so that an output of a suction confirmation signal ("A" signal) is stopped. If the release of the workpiece W from the sucker 13 is detected, the suction detection pressure Pj is set at the predetermined impossible-to-reach value Pu.

The detection of the suction preparation pressure Pset, the reference pressure Ps, and the drop detection pressure Pt by this suction/detection apparatus 32 is carried out based on a signal outputted from the apparatus controller 30. Then, suction confirmation of the workpiece W and a result of its drop recognition are sent, as a suction confirmation signal ("A" signal) or a drop signal ("E" signal), from the suction/detection apparatus 32 to the apparatus controller 30.

Next, the transfer procedure for transferring the workpiece W by using the vacuum-suction/transfer apparatus 11 will be described.

When the workpieces W on the component supply stage 12 are transferred to the printed circuit board 14, as shown in FIG. 1A, the carrying head 15 is moved onto the component supply stage 12 after the piston rod 17 ascends. Next, the vacuum supply valve 23 is opened to supply the negative pressure to the suction/release passage 28, and the negative pressure value of the suction/release passage 28 rises to the suction preparation pressure Pset. Under this condition, as shown in FIG. 1B, the compressed air is supplied to the pneumatic cylinder 16 and the piston rod 17 descends, and since the contact face 21 of the sucker 13 contacts with the workpiece W, the workpiece W is sucked by the sucker 13 due to the negative pressure.

Next, after the piston rod 17 of the pneumatic cylinder 16 retreats, the carrying head 15 is moved horizontally toward the printed circuit board 14, as shown in FIG. 1C. Then, after the carrying head 15 moves to a predetermined position of the printed circuit board 14, as shown in FIG. 1D, the piston rod 17 descends, whereby the workpiece W is disposed on the printed circuit board 14. In this way, the workpieces W are transferred to the printed circuit board 14 from the component supply stage 12.

When the workpiece W is disposed at the predetermined position of the printed circuit board 14, the supply of the negative pressure to the suction/release passage 28 is stopped and the vacuum breakage valve 25 is opened, whereby positive pressure air is supplied, as air for vacuum breakage, to the vacuum suction port 22. Consequently, the workpiece W is securely separated from the contact face 21 of the sucker 13. After separation of the workpiece W therefrom is completed, as shown in FIG. 1E, placing the single workpiece W onto the printed circuit board 14 is ended by ascent of the piston rod 17 and the carrying head 15 is again moved horizontally toward the component supply stage 12.

Figure 3:
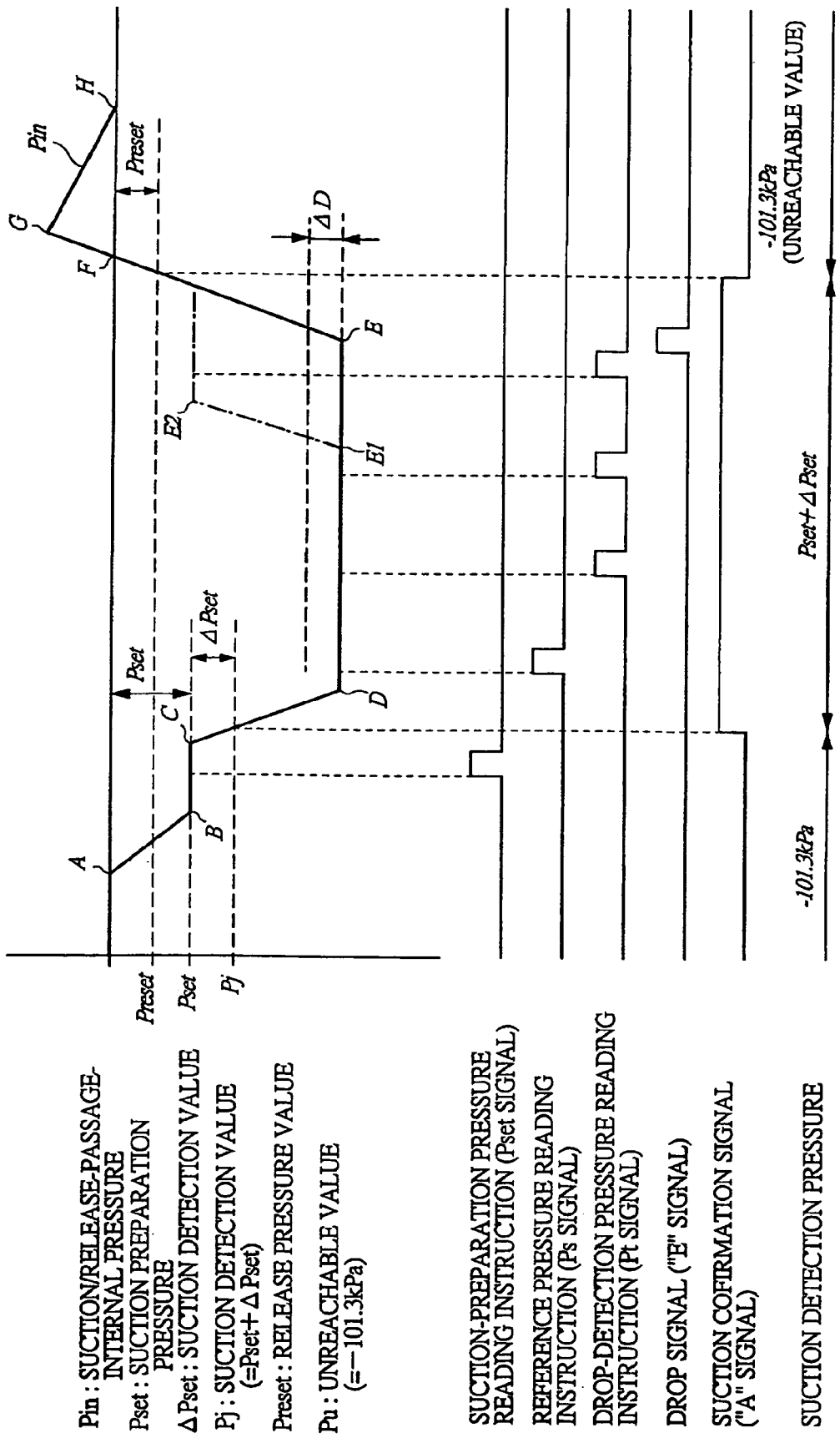
FIG. 3 is a time chart showing a change in pressure in the suction/release passage detected by a suction pressure sensor when a sucker sucks and transfers a workpiece to a printed circuit board from a component supply stage.

FIG. 3 is a time chart showing a change in pressure in the suction/release passage detected by a suction pressure sensor when the sucker sucks and transfers the workpiece to the printed circuit board from the component supply stage. First, when the vacuum supply valve 23 and the vacuum breakage valve 25 are both set at closed states, the suction/release-passage-internal pressure Pin stays the atmospheric pressure as indicated by points A to H. If the vacuum supply valve 23 is set at an open position and the negative pressure is supplied to the suction/release passage 28, the suction/release-passage-internal pressure Pin becomes lower than the atmospheric pressure and the negative pressure rises and when suction/release-passage-internal pressure Pin reaches a point B set at the suction preparation pressure Pset, an equilibrium condition is attained. If the sucker 13 is brought into contact with the workpiece W at a point C and the suction operation is started, the suction/release-passage-internal pressure Pin lowers and reaches a point D and the workpiece W is sucked by the sucker 13.

The transfer of the workpiece W is started after the workpiece W is sucked by the sucker 13, that is, after the apparatus controller 30 receives a suction confirmation signal ("A" signal) from the suction/detection apparatus 32.

If the transfer of the workpiece W is completed and the workpiece W is disposed at a predetermined position, the vacuum supply valve 23 is set to the closed position at a point E to stop the supply of the negative pressure. Concurrently, the vacuum breakage valve 25 is set to the open position to supply the positive pressure to the suction/release passage 28, so that the negative pressure lowers and the workpiece W is separated from the sucker 13. Then, the suction/release-passage-internal pressure Pin rises to the atmospheric pressure at a point F due to the supply of the positive pressure, and further the suction/release-passage-internal pressure Pin rises to a point G set at pressure of the compressed air supplied from the positive pressure source 26. Thereafter, when the vacuum breakage valve 25 is set to the closed position at a point G, the suction/release-passage-internal pressure Pin lowers to the atmospheric pressure and reaches a point H.

Incidentally, during the transfer of the workpiece W using this vacuum-suction/transfer apparatus 11, the drop of the workpiece W from the sucker 13 occurs in some cases. As a cause for the drop of the workpiece W during the transfer, for example, an influence of vibrations during the transfer is conceivable. However, if the workpiece W drops, the sucker 13 becomes in a state of sucking nothing, so that the negative pressure value of the suction/release passage 28 is reduced to the suction preparation pressure Pset. A pressure curve shown by a dot and dash line in FIG. 3 represents a change in the suction/release-passage-internal pressure Pin when the workpiece W drops during the transfer of the workpiece W. As shown in the Figure, if the workpiece W drops during the transfer, the suction/release-passage-internal pressure Pin under the equilibrium condition rises from pressure of the equilibrium condition shown by a point E1 to the suction preparation pressure Pset shown by a point E2.

Thus, in view of the fact that the negative pressure value of the suction/release passage 28 does not change because the sucker 13 is in a closed state as long as the workpiece W contacts with and is sucked by the contact face 21, the drop recognition of the workpiece W during the transfer is carried out by making the detection of whether the negative pressure value of the suction/release passage 28 has changed beyond the predetermined allowable deflection width $\Delta D$. The reason why the predetermined allowable deflection width $\Delta D$ is preliminarily set is that the negative pressure value of the suction/release passage 28 is not always stabilized due to leakage or the like in use. Therefore, if a difference between the reference pressure Ps which is the suction/release-passage-internal pressure at a time of confirming the suction and the drop detection pressure Pt detected during the transfer of the workpiece W is smaller than the predetermined allowable deflection width $\Delta D$, it is judged that the workpiece W is sucked. If the difference is larger than the width $\Delta D$, it is judged that the workpiece W has been dropped.

Figure 4:
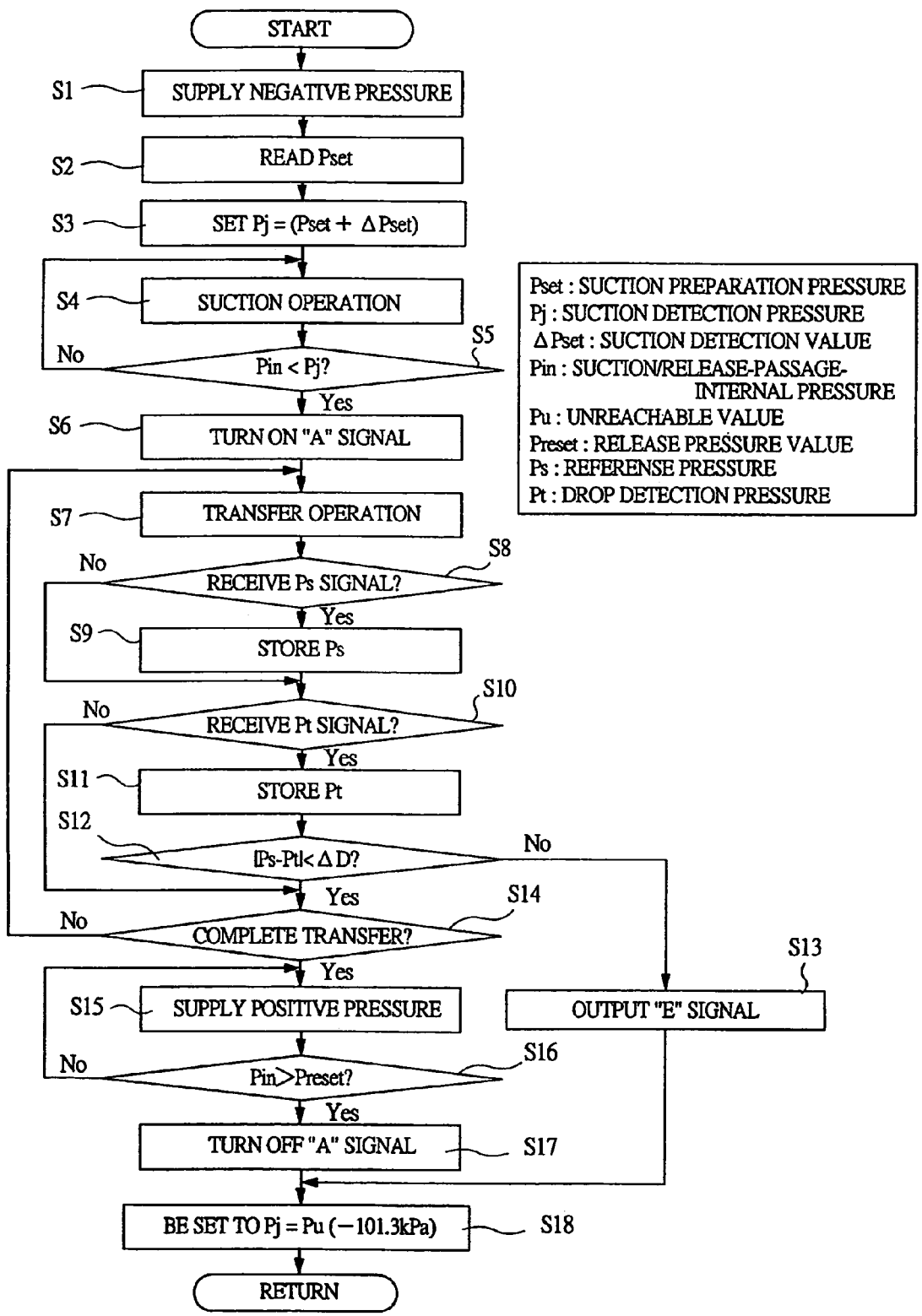
FIG. 4 is a flow chart showing an operation procedure of the sucker when the workpiece is sucked and transferred.

FIG. 4 is a flow chart showing an operation procedure of the sucker when the workpiece is sucked and transferred. Hereinafter, the operation procedure of the sucker 13 and a suction detection method of the workpiece W will be described with reference to FIGS. 3 and 4.

First, the vacuum supply valve 23 is set at the open position and the negative pressure air is supplied to the suction/release passage 28 (step S1). After the supply of the negative pressure air is started, a predetermined period of time elapses and the suction/release-passage-internal pressure Pin passes the point B and is stabilized. At this time, if a suction-preparation pressure reading instruction (Pset signal) is outputted from the apparatus controller 30, reading of the suction preparation pressure Pset is carried out by the suction/detection apparatus 32 in step S2. Then, in step S3, the suction/detection apparatus 32 sets the suction detection pressure value Pj to a value obtained by adding a predetermined detection value $\Delta$Pset to the read suction preparation pressure Pset, i.e., to "Pj=Pset+$\Delta$Pset" and stores the set value in the memory. Namely, as a suction detection-pressure setting step in the vacuum-suction/transfer apparatus 11, each time the suction preparation pressure Pset is detected, a new suction detection pressure Pj is set by adding the suction detection value $\Delta$Pset to this suction preparation pressure Pset, so that the suction detection pressure Pj in the memory is rewritten to the new suction detection pressure Pj on each suction.

Next, when the suction operation is carried out in step S4 and the contact face 21 of the sucker 13 contacts with the workpiece W, the suction/release-passage-internal pressure Pin lowers from the point C toward the point D. Step S5 is a suction detection step, so that if it is recognized that the suction/release-passage-internal pressure Pin is equal to or less than the suction detection pressure Pj, i.e., "Pin$\leq$Pj" by comparing the suction/release-passage-internal pressure Pin with the suction detection pressure Pj, the suction of the workpiece W is detected and a suction confirmation signal ("A" signal) is outputted from the suction/detection apparatus 32 to the apparatus controller 30 in Step S6. Then, after the apparatus controller 30 receives the suction confirmation signal ("A" signal), the transfer operation is started by the apparatus controller 30 in Step S7 and the workpiece W is transferred in a state of being sucked by the sucker 13.

During this transfer, the drop recognition of the workpiece W from the sucker 13 is carried out. To carry out this drop recognition, the reference pressure Ps and the drop detection pressure Pt are required to have been read for comparison in the suction/detection apparatus 32. Here, the reference pressure Ps is read by using the suction pressure sensor 31 when the suction/detection apparatus 32 receives a reference pressure reading instruction (Ps signal) under the condition that the workpiece W has been sucked and the transfer is not started. Meanwhile, the drop detection pressure Pt is read by using the suction pressure sensor 31 when the suction/detection apparatus 32 receives a drop-detection pressure reading instruction (Pt signal). The drop-detection pressure reading instruction (Pt signal) is regularly transmitted by the apparatus controller 30 during the transfer.

If the suction/detection apparatus 32 receives the reference pressure reading instruction (Ps signal) in step S8, the suction/release-passage-internal pressure Pin of the suction/release passage 28 at a time of receiving the signal is detected and is stored in the memory of the suction/detection apparatus 32 (step S9). Unless the reference pressure reading instruction (Ps signal) is received, this operation procedure proceeds to step S10 as branched by the step S8, i.e., so that step S9 is omitted. If the suction/detection apparatus 32 receives the drop-detection pressure reading instruction (Pt signal) in step S10, the suction/release-passage-internal pressure Pin of the suction/release passage 28 at a time of receiving the signal is detected and is stored in the memory of the suction/detection apparatus 32 (step S11). In step S12, subtraction of the reference pressure Ps from the drop detection pressure Pt is carried out, and whether such a result of the subtraction is within the allowable deflection width $\Delta D$ is recognized. Note that this recognition is omitted unless the drop-detection pressure reading instruction (Pt signal) is received in the step S10.

If a result of the subtraction is not within the allowable deflection width $\Delta D$, namely, if it is recognized that the negative pressure of the drop detection pressure Pt exceeds an upper limit of the drop detection range, a drop signal ("E" signal) is outputted from the suction/detection apparatus 32 to the apparatus controller (step S13). Meanwhile, if the drop of the workpiece W is not detected and the completion of the transfer of the workpiece W is confirmed in step S14, the vacuum supply valve 23 is set to the closed position and the vacuum breakage valve 25 is set to the open position, so that the positive pressure is supplied to the suction/release passage 28 (step S15). Then, when the suction/release-passage-internal pressure Pin rises and the suction/release-passage-internal pressure Pin reaches at a release pressure value Preset, namely, "Pin≧Preset" is detected in step 16, this means the release of the workpiece W so that the suction confirmation signal ("A" signal) is turned OFF in step S17. Next, if the release of the workpiece W is detected, the value of suction detection pressure Pj in the memory of the suction/detection apparatus 32 is rewritten to the unreachable value Pu in step S18. At the same time, the carrying head 15 is again moved to the component supply stage 12 and the routine is returned to the step S1. The suction detection pressure Pj is maintained at the unreachable value Pu until the suction detection pressure Pj is set again in the step S3 via the steps S1, S2.

Incidentally, the vacuum-suction/transfer apparatus includes an apparatus in which, in order to transfer the plurality of workpieces W all at once, the plurality of suckers 13 each provided with an opening/closing valve 35 are connected to the common negative pressure source 24 through a common suction unit 36.

Figure 5:
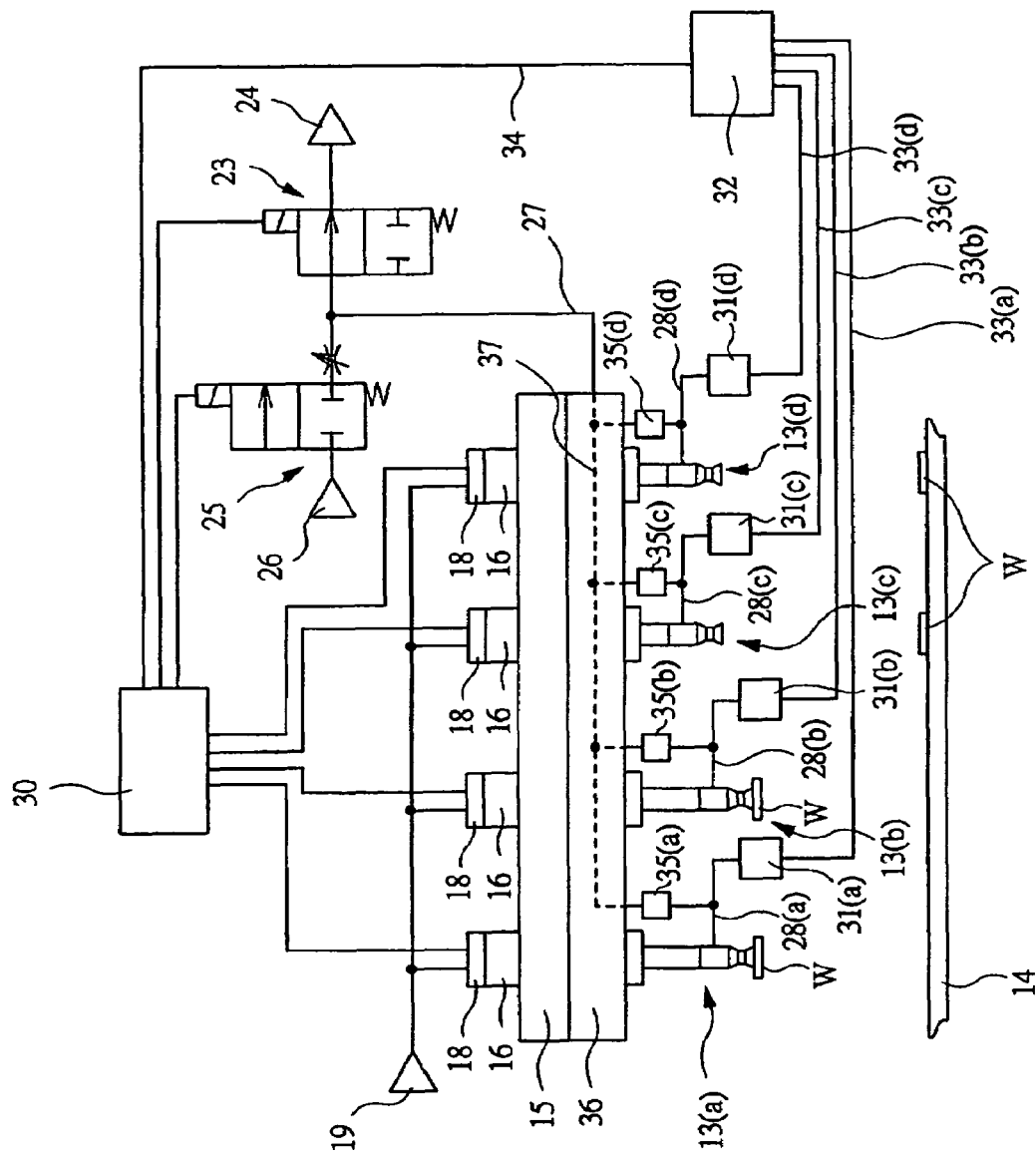
FIG. 5 is a block diagram showing schematically a vacuum-suction/transfer apparatus connecting a plurality of suckers to a common negative pressure source by using a suction unit in which a communication passage that communicates with respective suction/release passages formed in the plurality of suckers is formed.

FIG. 5 is a block diagram showing schematically the vacuum-suction/transfer apparatus connecting the plurality of suckers to a common negative pressure source by using the suction unit in which the communication passage that communicates with respective suction/release passages formed in the plurality of suckers is formed. Note that components common to the vacuum-suction/transfer apparatus 11 shown in FIG. 2 are denoted by the same reference numerals. When illustrated, four suckers 13(a) to 13(d) are connected to the suction unit 36. Suction pressure sensors 31(a) to 31(d), connected to the suction/detection apparatus 32 through communication cables 33(a) to 33(d), are attached to the suckers 13(a) to 13(d), respectively, so that the suction/release-passage-internal pressure Pin of each of the suckers 13(a) to 13(d) can be detected.

This suction unit 36 is provided with a communication passage 37 for communicating with the suction/release passages 28(a) to 28(d) formed in the suckers 13(a) to 13(d) and the carrying head 15 and the sources 19, 24, 26 for supplying air pressure can be shared, so that the suction unit is used in many cases to transfer the large number of workpieces W once. On the other hand, a change in pressure within the suction unit 36 causes a change in the negative pressure supplied to each of the suction/release passages 28(a) to 28(d). For example, if any one of the opening/closing valves 35(a) to 35(d) provided in the respective suckers 13(a) to 13(d) is opened or two or more thereof are opened or if a pressure condition within the suction unit 36 is changed due to an original pressure change etc., the negative pressure supplied to each of the suckers 13(a) to 13(d) is also changed.

The suction/transfer apparatus 32 according to the present invention can detect the drop of the workpiece W even if the negative pressure supplied during the transfer is thus changed. That is, if any one of the opening/closing valves 35(a) to 35(d) is opened or two or more thereof are opened or if the supplied negative pressure is changed due to the original pressure change etc., the apparatus controller 30 resends the reference pressure reading instruction (Ps signal) to the suction/detection apparatus 32. Next, when the suction/detection apparatus 32 reads again the reference pressure Ps and consequently this reference pressure Ps is different from the previous reference pressure Ps, a new drop detection range is computed by adding a predetermined allowable deflection width ΔD to the latest reference pressure Ps and the previous drop detection range is rewritten. Thereafter, by making the drop detection based on the new drop detection range, the suction/transfer apparatus distinguishes the case where any one of the opening/closing valves 35(a) to 35(d) is opened from the case where two or more thereof are opened and distinguishes a change in the supplied negative pressure caused due to the original pressure change etc. from a change in the suction/release-passage-internal pressure Pin caused due to the drop of the workpiece W, thereby making it possible to make the accurate drop detection. Further, if the reference pressure Ps is rewritten each time an operation for changing the pressure is performed, it is not necessary to make the allowable deflection width ΔD set larger than that required by considering the case where a pressure change occurs in multiple stages, so that speeding up the drop recognition can be achieved.

Figure 6:
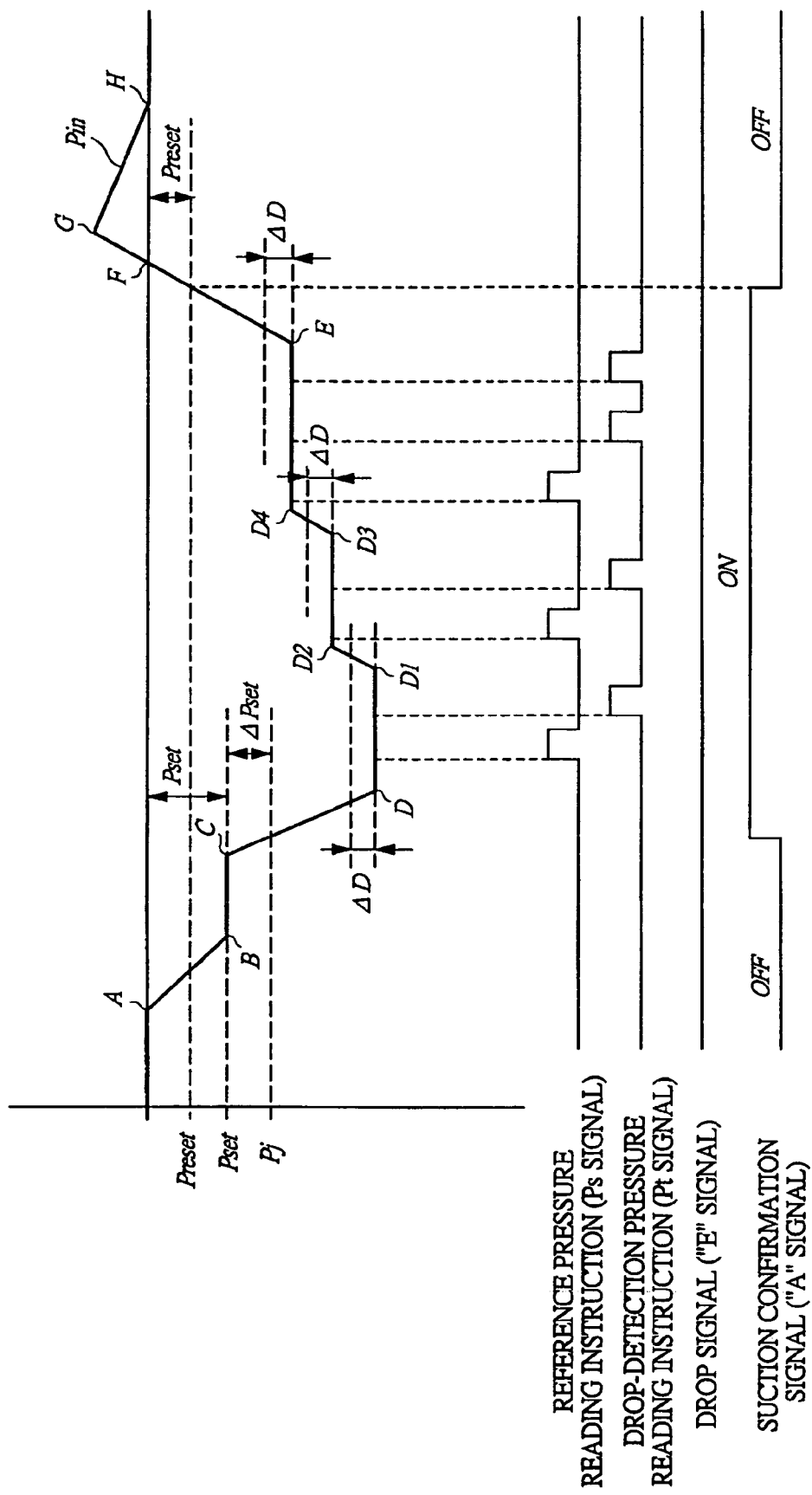
FIG. 6 is an explanatory diagram of the suction detection method of the case where a change in pressure occurs within the suction unit during the transfer of the workpiece.

FIG. 6 is an explanatory diagram of a suction detection method of the case where a change in pressure occurs within the suction unit during the transfer of the workpiece. As shown in the Figure, for example, if the operation for changing the pressure is carried out at a point D1 and the suction/release-passage-internal pressure Pin decreases to a negative pressure value indicated at a point D2, a new drop detection range is set by reading again the reference pressure Ps. This is the same as the cases where the operation for changing the pressure is carried out at a point D3 and where the negative pressure value within the suction/release passage 28 is reduced to a point D4. Thus, each time the operation for changing the pressure is carried out, the previous drop detection range is rewritten to a new drop detection range to recognize the drop of the workpiece W. As a result, even if any one of the opening/dosing valves 35(a) to 35(d) is opened or two or more thereof are opened or if the negative pressure supplied to the suction/release passage 28 exceeds the drop detection range due to the source pressure change etc. and further is lowered the lowering of the supplied negative pressure and the lowering of the negative pressure value due to the drop of the workpiece W are distinguished from each other, so that only the drop pf the workpiece W is correctly recognized. Note that although only the case where the negative pressure value of the sucker 13 is gradually reduced is illustrated for the drawings, such drawings can be of course applied also to the case where the negative pressure value is gradually raised.

The present invention is not limited to the above-mentioned embodiment and may be variously modified within the scope that does not depart from the gist thereof. For example, although the four suckers 13(a) to 13(d) are connected to the suction unit 36 in the vacuum-suction/transfer apparatus shown in FIG. 5, the number of suckers to be connected is not limited to this case.

A means for connecting each of the apparatus controller 30 and the suction pressure sensor 31 to the suction/detection apparatus 32 is not limited to the wired communication cables 33, 34, and a radio communication means may be used to send and receive signals. Thus, since the apparatus controller 30, the suction pressure sensor 31, and the suction/detection apparatus 32 are provided separately, a degree of freedom of arranging these components is high, so that each of them can be disposed optimally.

The timing of the drop recognition of the workpiece W can be changed freely by operating the apparatus controller 30. For example, in the case where whether any workpiece W is mounted on the printed circuit board 14 is recognized, the drop recognition of the workpiece W may be carried out by reading the drop detection pressure reading instruction Pt just before the workpiece W is placed on the printed circuit board 14. Meanwhile, if it is intended to stop the transfer immediately after the drop recognition of the workpiece W (after receiving the "E" signal), the drop recognition may be cyclically made by sending the drop detection pressure reading instruction Pt to the suction detection apparatus 32 per predetermined cycle and, after receiving the "E" signal, the transfer may be immediately stopped.

Additionally, the above-mentioned embodiment is such that the suction detection pressure Pj is set at the unreachable value Pu when the suction/release-passage-internal pressure Pin becomes equal to the release pressure value Preset. However, it is not limited to this case and may be set at any timing within a range after the release of the workpiece W is detected and before the negative pressure air is supplied again to the suction/release passage 28. Further, the above-mentioned embodiment is such that the unreachable value Pu is set at −101.3 kPa which is an absolute vacuum. However, it is not limited to this case and may be set at such any value as not to be able to reach the suction preparation pressure Pset changing in accordance with various conditions such as replacing the suction 13. Further, in the above-mentioned embodiment, this vacuum-suction/transfer apparatus 11 is applied to the case of transferring the workpiece W to the printed circuit board 14 from the component supply stage. However, the vacuum-suction/transfer apparatus is not limited to this case and may be applied to other purposes such as the case of transferring the workpiece W to the test instrument instead of the printed circuit board.

INDUSTRIAL APPLICABILITY

This suction detection method and suction detection apparatus can be used for detecting the suction/drop of the workpiece when the workpiece such as IC and LSI is transferred to the test instrument or printed circuit boar by vacuum suction.

The invention claimed is:

1. A suction detection method to detect whether a workpiece is sucked by a sucker having a suction/release passage connected to a negative pressure passage, the method comprising:
a reference pressure reading step of reading, as reference pressure, pressure in said suction/release passage under the condition that the workpiece is sucked by said sucker;
a drop-detection range setting step of setting a drop detection range by adding predetermined allowable deflection width to said reference pressure;
a drop-detection pressure reading step of reading, as drop detection pressure, the pressure in said suction/release passage; a recognizing step of recognizing whether said drop detection pressure is equal to or more than an upper limit value of said drop detection range; and
a drop-signal outputting step of outputting a drop signal when it is recognized that said drop detection pressure is equal to or more than said upper limit value.

2. The suction detection method according to claim 1, further comprising:
a rewriting step of being rewritten to a new drop detection range when said reference pressure is different from the previous reference pressure.

3. The suction detection method according to claim 1, wherein by reading said reference pressure based on a reference-pressure reading instruction and then reading said drop detection pressure based on a drop-detection pressure reading instruction, it is recognized whether said drop detection pressure is equal to or more than an upper limit value of said drop detection range.

4. A suction detection apparatus to detection whether a workpiece is sucked by a sucker having a suction/release passage connected to a negative pressure source, the apparatus comprising:
a reference pressure reading means for reading, as reference pressure, pressure in said suction/release passage under the condition that the workpiece is sucked by said sucker;
a drop-detection range setting means for setting a drop detection range by adding predetermined allowable deflection width to said reference pressure;
a drop-detection pressure reading means for reading, as drop detection pressure, the pressure in said suction/release passage;
a recognizing means for recognizing whether said drop detection pressure is equal to or more than an upper limit value of said drop detection range; and
a drop-signal outputting means for outputting a drop signal when it is recognized that said drop detection pressure is equal to or more than said upper limit value.

5. The suction detection apparatus according to claim 4, wherein the drop detection range is newly rewritten if said reference pressure is different from the previous reference pressure.

6. The suction detection method according to claim 4, wherein by reading said reference pressure based on a reference-pressure reading instruction and then reading said drop detection pressure based on a drop-detection pressure reading instruction, it is recognized whether said drop detection pressure is equal to or more than the upper limit value of said drop detection range.

* * * * *

UNITED STATES PATENT AND TRADEMARK OFFICE
CERTIFICATE OF CORRECTION

PATENT NO. : 7,263,890 B2  Page 1 of 1
APPLICATION NO. : 10/558127
DATED : September 4, 2007
INVENTOR(S) : Yuji Takahashi It is certified that error appears in the above-identified patent and that said Letters Patent is hereby corrected as shown below:

On the title page item (54), and col. 1, line 1, delete the title "VACUUM CLAMPING DETECTION METHOD AND VACUUM CLAMPING DETECTOR" and replace with --SUCTION DETECTION METHOD AND SUCTION DETECTION APPARATUS--.

Signed and Sealed this

First Day of January, 2008

JON W. DUDAS
*Director of the United States Patent and Trademark Office*